US010780997B1

(12) United States Patent
Bigelow et al.

(10) Patent No.: US 10,780,997 B1
(45) Date of Patent: Sep. 22, 2020

(54) SYSTEMS AND METHODS FOR SHOCK-RESISTANT MEMORY DEVICES

(71) Applicant: National Technology & Engineering Solutions of Sandia, LLC, Albuquerque, NM (US)

(72) Inventors: Josiah Bigelow, Albuquerque, NM (US); Brandon Toepper, Rio Rancho, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 16/460,388

(22) Filed: Jul. 2, 2019

Related U.S. Application Data

(60) Provisional application No. 62/695,371, filed on Jul. 9, 2018.

(51) Int. Cl.
| | |
|---|---|
| *H05K 5/06* | (2006.01) |
| *B64G 1/52* | (2006.01) |
| *H05K 5/02* | (2006.01) |
| *B64G 1/62* | (2006.01) |
| *H05K 5/04* | (2006.01) |
| *B64G 1/10* | (2006.01) |

(52) U.S. Cl.
CPC ............. *B64G 1/52* (2013.01); *B64G 1/10* (2013.01); *B64G 1/62* (2013.01); *H05K 5/0239* (2013.01); *H05K 5/04* (2013.01); *H05K 5/061* (2013.01); *H05K 5/064* (2013.01); *H05K 5/069* (2013.01)

(58) Field of Classification Search
CPC ... B64G 1/52; B64G 1/62; B64G 1/10; H05K 5/04; H05K 5/061; H05K 5/0239; H05K 5/064; H05K 5/069; H05K 5/0213; H05K 3/284
USPC .......................................... 174/544; 206/522
See application file for complete search history.

(56) References Cited

U.S. PATENT DOCUMENTS

| | | | |
|---|---|---|---|
| 3,508,724 A | 4/1970 | Scher et al. | |
| 3,614,031 A | 10/1971 | Demboski | |
| 4,696,444 A * | 9/1987 | Regipa .................. | B64B 1/60 244/127 |
| 5,123,538 A * | 6/1992 | Groenewegen ...... | H05K 9/0064 206/521 |
| 5,285,559 A | 2/1994 | Thompson et al. | |

(Continued)

*Primary Examiner* — Steven T Sawyer
(74) *Attorney, Agent, or Firm* — Medley, Behrens & Lewis, LLC; Samantha Updegraff

(57) ABSTRACT

A shock-resistant memory device comprises a housing and a memory module. The memory module is disposed within the housing and surrounded by potting material to protect the memory module from damage during a shock event. The housing can include a port that accommodates a data connection between the memory module and a sensor from which data is desirably received by the memory module. During a shock event the connection between the memory module and the sensor may be severed, but data stored in the memory module can be retained in the memory module which is protected by the housing. To facilitate retrieval of the memory device subsequent to a shock event, a balloon can be affixed to the housing. The balloon can be configured to inflate subsequent to the shock event so that the shock-resistant memory device does not sink in water and to make the memory device more visible for recovery.

18 Claims, 6 Drawing Sheets

(56) References Cited

U.S. PATENT DOCUMENTS

| | | | | |
|---|---|---|---|---|
| 5,708,565 | A | 1/1998 | Fairbanks | |
| 5,802,479 | A * | 9/1998 | Kithil | B60N 2/002 257/295 |
| 5,995,460 | A | 11/1999 | Takagi et al. | |
| 8,294,790 | B2 | 10/2012 | Godfrey et al. | |
| 8,670,879 | B1 * | 3/2014 | Angelucci | B64D 45/00 701/14 |
| 2009/0132129 | A1 * | 5/2009 | Breed | B60N 2/002 701/45 |
| 2009/0303686 | A1 * | 12/2009 | Hall | E21B 47/017 361/752 |
| 2010/0270425 | A1 * | 10/2010 | Zur | B64B 1/40 244/33 |
| 2012/0048103 | A1 * | 3/2012 | Beach | F41H 5/026 89/36.17 |
| 2013/0095583 | A1 * | 4/2013 | Chang | H01L 33/486 438/27 |
| 2015/0118460 | A1 * | 4/2015 | Mount, III | B05D 5/00 428/209 |
| 2018/0131124 | A1 * | 5/2018 | Matlack | F04D 29/086 |

\* cited by examiner

SYSTEMS AND METHODS FOR SHOCK-RESISTANT MEMORY DEVICES

RELATED APPLICATIONS

This application claims priority to U.S. Provisional Patent Application No. 62/695,371, filed on Jul. 9, 2018, and entitled "BALLISTIC AFT-LAUNCHED TELEMETRY (BASALT)", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Spacecraft, such as satellites, capsules, and other vehicles commonly transmit telemetry data such as position, velocity, altitude, etc., to ground stations to facilitate tracking of the spacecraft, monitoring of spacecraft performance, or collection of other data generated by sensors on the spacecraft. Radio links between spacecraft and ground stations are often used for these purposes. Under some conditions, however, a radio link may be unreliable for communication between a spacecraft and a ground station. For instance, during re-entry of a spacecraft into the atmosphere, plasma formation around the spacecraft can interfere with radio communication between the spacecraft and a ground station. Many spacecrafts are not designed to survive re-entry due to various design considerations such as size, weight, cost, and complexity. Accordingly, it has largely been impossible to collect sensor data generated by sensors on board a spacecraft during re-entry of the spacecraft without using high-power transmitters capable of maintaining a radio link in spite of plasma interference. Such transmitters are weight- and power-prohibitive in many spacecraft designs.

SUMMARY

The following is a brief summary of subject matter that is described in greater detail herein. This summary is not intended to be limiting as to the scope of the claims.

A shock-resistant memory device is described herein that is capable of withstanding shocks associated with Earth impact of a spacecraft subsequent to reentry of the spacecraft into the atmosphere. In an exemplary application, the memory device can be used in connection with recording sensor data output by a sensor mounted on a spacecraft during a period wherein a radio uplink between the spacecraft and a ground station is interrupted. Subsequent to impact of the spacecraft with the Earth (e.g., by way of impact with the ground or water), the shock-resistant memory device can be recovered, and data contents of the memory read to recover the sensor data. In this way, sensor data generated during re-entry of a spacecraft by sensors mounted on the spacecraft can be recovered without requiring high-power transmitters to be incorporated in the spacecraft.

An exemplary shock-resistant memory device comprises a housing and an electronics package that includes a memory module. The electronics package is disposed within the housing and can be surrounded by a potting material, such as an epoxy, to protect the electronics package and its corresponding memory module from being damaged upon impact. The housing can include a port through which an electrical or optical connection can be made between the memory module and a sensor from which data is desirably received by the memory module. During a high-shock event the connection between the memory module and the sensor may be severed, but data stored in the memory module can be safely retained in the memory module and protected by the housing.

In order to facilitate retrieval of the shock-resistant memory device subsequent to a high-shock event such as a spacecraft on which the memory device is mounted impacting with the Earth, a balloon can be affixed to the housing. The balloon can be configured to inflate subsequent to the high-shock event to ensure that the shock-resistant memory device does not sink in the case of water impacts and to make the memory device more visible for recovery. The shock-resistant memory device can further be equipped with a transmitter included in the electronics package and an antenna that is connected to the transmitter. The transmitter and the antenna collectively serve as a radio beacon that can be used to locate the shock-resistant memory device prior to visual acquisition of the shock-resistant memory device.

While certain exemplary aspects are described with respect to use of a shock-resistant memory device in connection with reentry of a vehicle into an atmosphere, it is to be understood that shock-resistant memory devices described herein are suitable for use in any of various environments with the potential for high-impact events. For example, shock-resistant memory devices described herein can be mounted on aircraft or other vehicles.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
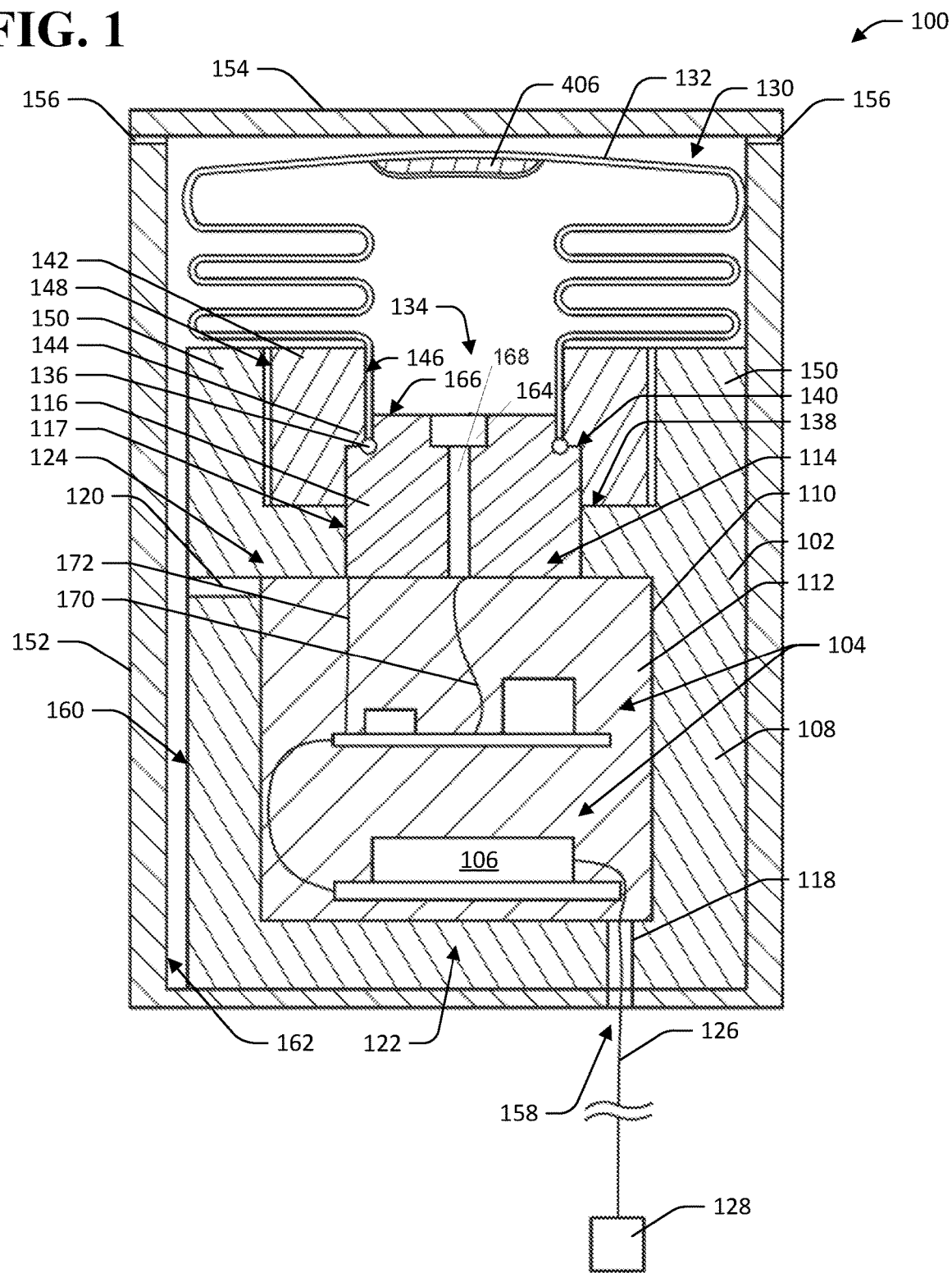
FIG. 1 is a cross-sectional diagram illustrating an exemplary shock-resistant memory device.

Various technologies pertaining to shock-resistant memory devices are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

With reference to FIG. 1, a cross-sectional view of an exemplary shock-resistant memory device 100 that is configured to record data output by a sensor and to survive high-shock events (e.g., accelerations greater than about 300,000 g's, wherein 1 g is approximately equal to 9.81 m/s$^2$) for subsequent retrieval of the data is illustrated. The shock-resistant memory device 100 includes a housing 102 and an electronics package 104 that is disposed within the housing 102. The housing 102 can be substantially cylindrical. The electronics package 104 comprises a memory module 106 that stores data for retrieval subsequent to a high-shock event such as an impact. The shock-resistant memory device 100 is configured to allow the memory module 106 to survive a high-shock event and to preserve data for subsequent retrieval. It is to be understood that while the shock-resistant memory device 100 is described as being able to survive a high-shock event, various components of the shock-resistant memory device 100 may be destroyed, consumed, or damaged by the high-shock event. The shock-resistant memory device 100 can be considered to have survived so long as the contents of the memory module 106 are preserved and able to be retrieved from the memory module 106.

Figure 2:
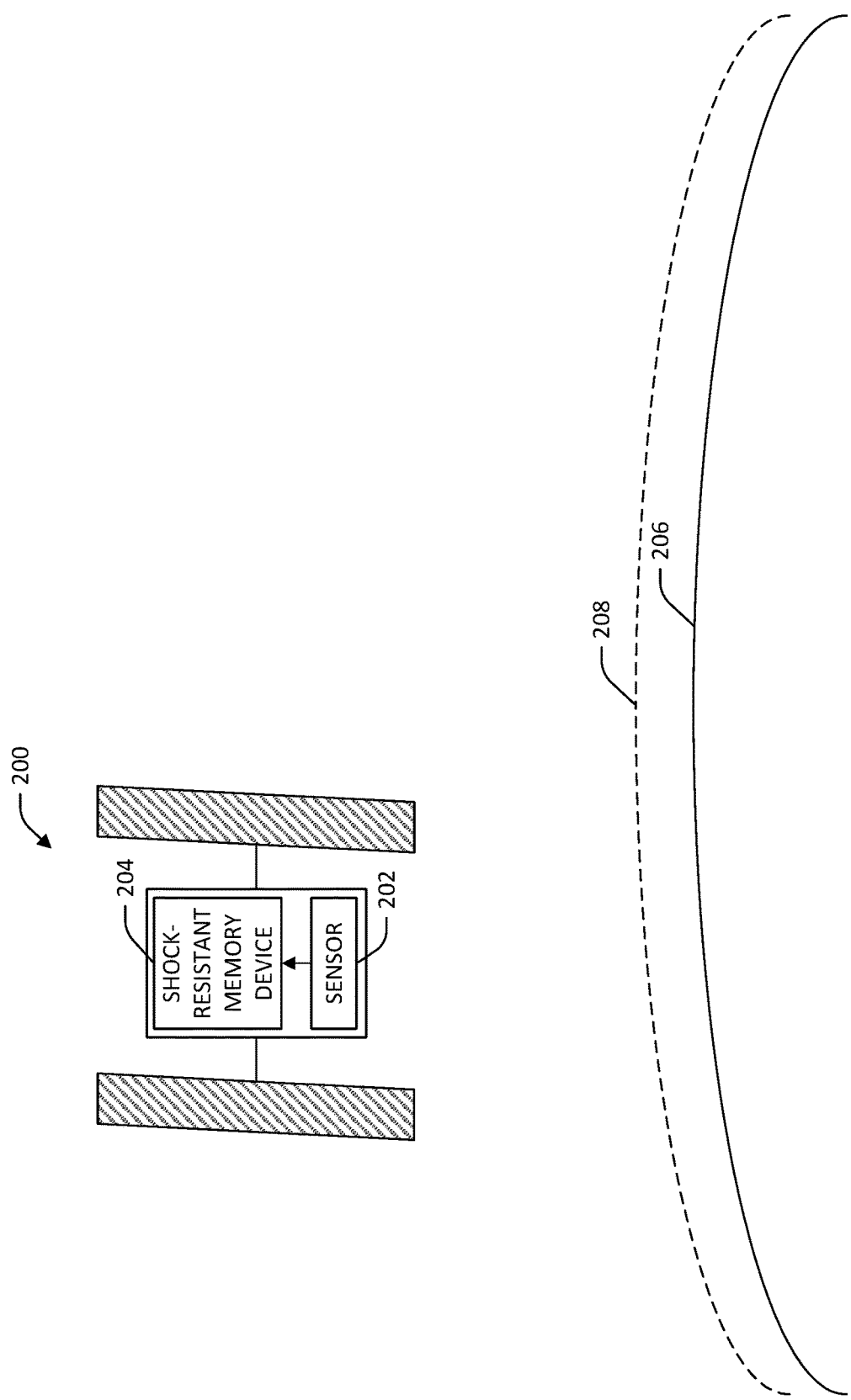
FIG. 2 is a diagram of an exemplary spacecraft that includes a shock-resistant memory device.

By way of example, and referring now to FIG. 2, an exemplary spacecraft 200 is shown wherein the spacecraft 200 has a sensor 202 and a shock-resistant memory device 204 (e.g., the shock-resistant memory device 100) included thereon. During orbit or other maneuvers of the spacecraft 200 above the surface of the Earth 206, the sensor 202 can output data to the shock-resistant memory device 204 wherein the data is data that is desirably retrieved from the spacecraft 200. The shock-resistant memory device 204 can be configured to store the data received from the sensor 202 for later retrieval. The sensor 202 can continue to output sensor data to the shock-resistant memory device 204 as the spacecraft 200 passes through the atmosphere 208, during a time when communication between the spacecraft and a receiver (e.g., a ground station) may be lost. Subsequently, upon impact with the Earth either in water or on land, the spacecraft 200 and the sensor 202 may be damaged beyond recovery. However, the shock-resistant memory device 204 can survive the impact in condition sufficient to allow data contents of a memory module included in the shock-resistant memory device 204 to be recovered.

It is to be understood that in some embodiments, the spacecraft 200 can be configured such that the sensor 202 outputs data to the shock-resistant memory device 204 for storage only after a re-entry condition (e.g., initiation of a re-entry maneuver by the spacecraft 200) or a loss of communication between the spacecraft and a receiver is detected. The sensor 202 and the shock-resistant memory device 204 can be so configured in order to conserve limited memory capacity of the shock-resistant memory device 204.

Figure 3:
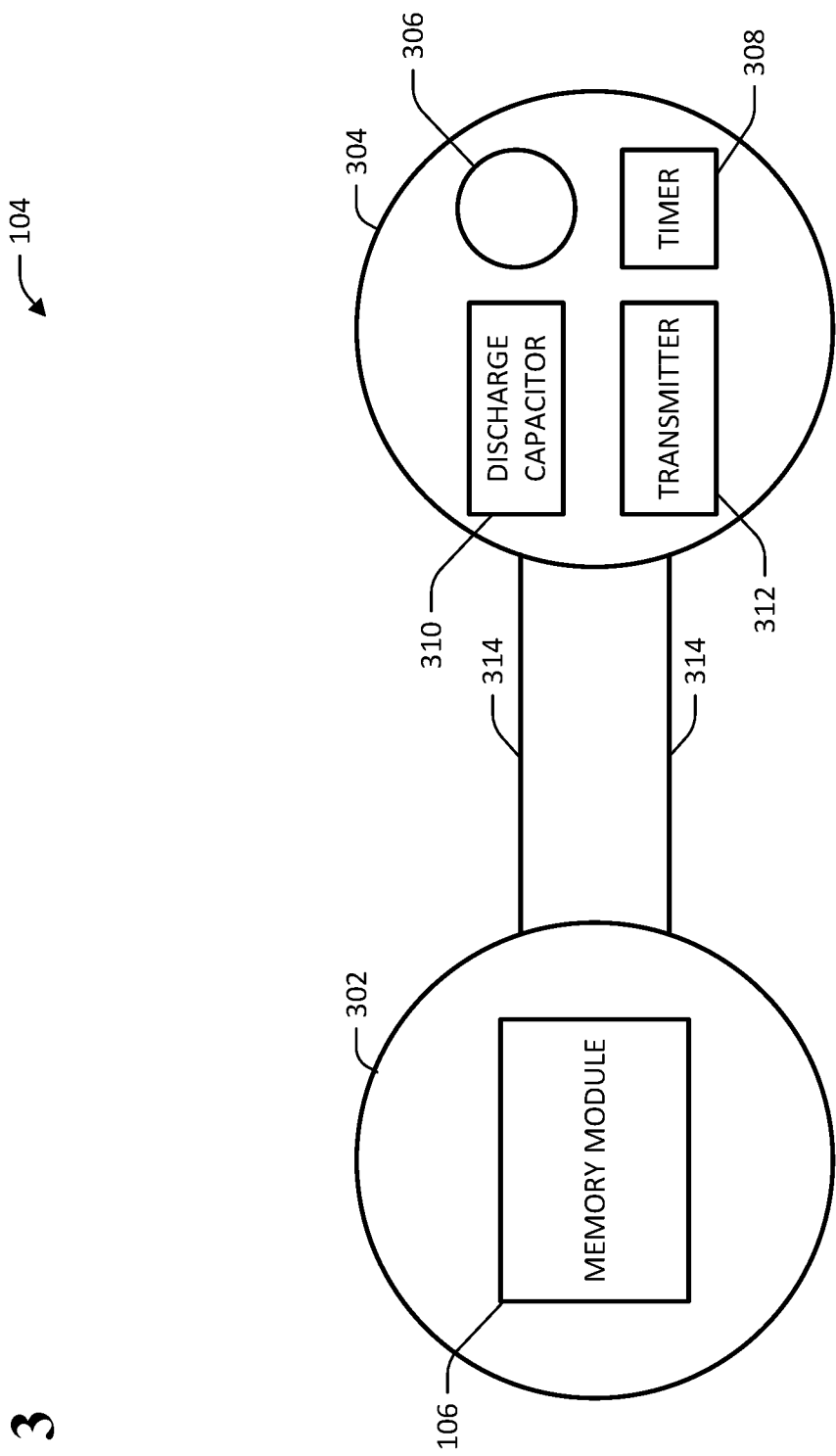
FIG. 3 is a diagram illustrating exemplary components of an electronics package of a shock-resistant memory device.

Various operations of the shock-resistant memory device 100 can be controlled by the electronics package 104 as will be described in greater detail below. Referring now to FIG. 3, a top view of the exemplary electronics package 104 is illustrated. The exemplary electronics package 104 includes a first circuit board 302 and a second circuit board 304. The first circuit board 302 includes a memory module 106. The second circuit board 304 can include a battery 306, a timer 308, a discharge capacitor 310, and a transmitter 312. The circuit boards 302, 304 are electrically connected to one another by way of connection wires 314 that can provide transmission of power or data between the circuit boards 302, 304. For example, the battery 306 can provide power to the memory modules 106 by way of the connection wires 314.

While the exemplary electronics package 104 is shown in FIGS. 1 and 3 as including two circuit boards 302, 304 with components integrated or installed thereon, it is to be understood that the electronics package can be implemented on more than two circuit boards or a single circuit board. Furthermore, while not specifically shown in FIG. 3, it is to be understood that conductive traces can be formed on either or both of the circuit boards 302, 304 in order to provide connections between components on the circuit boards 302, 304. In exemplary embodiments, the circuit boards 302, 304 are flexible circuit boards that are configured to deform without breaking and without delamination of traces or components included thereon.

Referring once again to FIG. 1, the housing 102 comprises a base portion 108 that has an interior cavity 110 formed therein. The base portion 108 and the interior cavity 110 can have substantially cylindrical shapes. The electronics package 104 is disposed within the interior cavity 110. The interior cavity 110 can be filled with a potting material 112 that secures the electronics package 104 within the interior cavity 110. In exemplary embodiments, the potting material 112 can be a flexible epoxy, a hard epoxy, or other material suitable for inhibiting movement of the electronics package 104 within the cavity 110. The base portion 108 of the housing 102 can include an opening 114 to the interior cavity 110 to allow for insertion of the electronics package 104 into the cavity 110 during assembly of the shock-resistant memory device 100. The housing 102 further includes a seal body 116 that can be secured to the base portion 108 of the housing 102 at the opening 114 in order to seal the opening 114 after the electronics package 104 has been inserted into the cavity 110. In an exemplary embodiment, the seal body 116 has threads formed on an exterior surface 117 of the seal body 116 that are configured to mate to threads formed in the base portion 108 of the housing 102 at the opening 114. In other embodiments, the seal body 116 can be secured to the base portion 108 of the housing 102 by way of fasteners, adhesives, or the like. In exemplary embodiments, the opening 114 can be substantially circular, and the seal body 116 can be substantially cylindrical in order to facilitate insertion of the seal body 116 into the opening 114.

The base portion 108 of the housing 102 can further include an inlet port 118 and an outlet port 120 by way of which the potting material 112 can be injected into the cavity 110. In an exemplary embodiment, the electronics package 104 is placed within the cavity 110 and the seal body 116 secured within the opening 114 prior to injection of the potting material 112. The inlet port 118 is positioned at a bottom end 122 of the cavity 110 and the outlet port 120 is positioned at a top end 124 of the cavity 110. When the potting material 112 is flowed into the cavity 110 by way of the inlet port 118, the potting material 112 displaces air in the cavity 110, which air exits the cavity 110 at the outlet port 120. The potting material 112 fills the cavity 110 such that the inlet port 118 and the outlet port 120 are sealed by the potting material 112. The potting material 112 inhibits movement of the electronics package 104 within the cavity 110 and improves the likelihood that the memory module 106 survives a high-impact event of the shock-resistant memory device 100.

Prior to injecting the potting material 112 into the cavity 110, a data connection line 126 can be inserted into either of the inlet port 118 (as shown in FIG. 1) or the outlet port 120. The data connection line 126 is connected to the memory module 106 and provides a means by which a sensor 128 or other device can output data to the memory module 106 for storage. When the potting material 112 is inserted into the cavity 110, the potting material fills the inlet port 118 thereby holding the data connection line 126 in place. The data connection line 126 can subsequently be connected to the sensor 128.

The shock-resistant memory device 100 further includes a balloon 130 that is affixed to the housing 102. The balloon 130 can be configured to inflate subsequent to a high-shock event being experienced by the shock-resistant memory device 100. The balloon 130 prevents sinking of the shock-resistant memory device 100 when the device 100 lands in water. The balloon 130 can further facilitate location of the device 100, as described in greater detail below.

The balloon 130 comprises an envelope 132 that forms the skin of the balloon 130. The envelope 132 defines a mouth 134 at the bottom of the balloon 130. The balloon 130 can further comprise an O-ring 136 at the mouth 134 of the balloon 130 to facilitate forming of a tight seal when the balloon 130 is inflated with a gas. The O-ring 136 can be affixed to the housing 102 by way of the seal body 116. By way of example, the seal body 116 can protrude from the opening 114 such that a portion of the seal body 116 extends above a surface 138 of the base portion 108 of the housing 102 at the opening 114. The O-ring 136 of the balloon 130 can be positioned around the protruding portion of the seal body 116 such that the mouth 134 of the balloon 130 is sealed around the seal body 116. The seal body 116 can further include a lip 138 on which the O-ring 136 rests in order to keep the O-ring 136 from sliding or rolling downward along the seal body 116.

In order to prevent disengagement of the balloon 130 from the seal body 116, the housing 102 can further include a seal cap 142. The seal cap 142 surrounds at least a portion of the seal body 116. Accordingly, in an exemplary embodiment the seal cap 142 can have a shape similar to a donut to match a substantially cylindrical shape of the seal body 116. The seal cap 142 is affixed to the seal body 116 such that the O-ring 136 is compressed between the seal body 116 and the seal cap 142. By way of example, the seal cap 142 can include a lip 144 that matches the lip 140 of the seal body 116. The O-ring 136 of the balloon 130 is compressed between the lip 140 of the seal body 116 and the lip 144 of the seal cap 142. The seal cap 142 ensures that a tight seal is maintained between the balloon 130 and the seal body 116 so that gas within the envelope 132 of the balloon 130 does not escape subsequent to deployment of the balloon 130.

The seal cap 142 has an interior surface 146 and an exterior surface 148. The seal cap 142 can be affixed to the seal body 116 by way of threads on the interior surface 146 of the seal cap 142. The threads on the interior surface 146 of the seal cap 142 can be configured to match threads on the exterior surface 117 of the seal body 116. The seal cap 142 can further be affixed to the base portion 108 of the housing 102 by way of threads on the exterior surface 148 of the seal cap 142. By way of example, the base portion 108 of the housing 102 can include a sidewall 150 that extends upward about the seal body 116 such that the sidewall 150 surrounds a portion of the seal body 116 that extends above the opening 114 in the base portion 108. The threads on the exterior surface 148 of the seal cap 142 can be configured to match threads formed on an interior surface 152 of the sidewall 150. The seal cap 142 can therefore be threaded into the base portion 108 of the housing 102 by way of the sidewall 150 and threaded around the seal body 116 by way of the exterior surface 117 of the seal body 116. In an exemplary embodiment, the threads on the interior surface 146 of the seal cap 142 are threaded in an opposite direction to the threads on the exterior surface 148 of the seal cap 142. During a high-shock event, the opposing threads on the surfaces 146, 148 of the seal cap 142 provide mutual tightening, making the seal cap 142 less likely to become disengaged from the housing 102.

In order to protect the balloon 130 from damage during a high-shock event and prior to deployment of the balloon 130, the shock-resistant memory device 100 can include an outer housing 152. The outer housing 152 surrounds the housing 102 and the balloon 130 in its uninflated state. By way of example, the outer housing 152 can be shaped similarly to a cup, and the housing 102 can be placed inside the cup with the envelope 132 of the balloon 130 folded on top of the housing 102. The balloon 130 and the housing 102 can be contained within the outer housing 152 by way of an outer housing cap 154 that rests on top of the outer housing 152. The outer housing cap 154 can be secured to the outer housing 152 by way of spot welds 156 that hold the outer housing cap 154 in place. The outer housing cap 154 and the spot welds 156 can be configured such that inflation of the balloon 130 causes the outer housing cap 154 to be separated from the outer housing 152, in order to allow the balloon 130 to fully inflate. The outer housing 152 can include an opening 158 that accommodates the data connection line 126. In exemplary embodiments, an exterior surface 160 of the base portion 108 of the housing 102 and an interior surface 162 of the outer housing 152 can have matching threads formed therein such that the base portion 108 screws into the outer housing 152.

The base portion 108, seal body 116, and seal cap 142 that make up the housing 102, the outer housing 152, and outer housing cap 154 can be composed of any of various metals or metal alloys. In various exemplary embodiments, the elements 108, 116, 142 of the housing 102, the outer housing 152, and the outer housing cap 154 can be made of any of various steels (e.g., a martensitic steel such as maraging steel), titanium, or a titanium alloy. In some embodiments, all of the elements 108, 116, 142 of the housing 102, the outer housing 152, and the outer housing cap 154 may be composed of a same material. In other embodiments, the elements 108, 116, 142, the outer housing 152, and the outer housing cap 154 can be composed of different materials.

The balloon 130 can be deployed by ignition of a pyrotechnic element positioned inside the balloon 130, wherein combustion of the pyrotechnic element causes the release of gases that inflate the balloon 130. The exemplary shock-resistant memory device 100 comprises a pyrotechnic pellet 164 positioned on top of or embedded in a top surface 166 of the seal body 116. Since the mouth 134 of the balloon 130 is positioned around the seal body 116, when the pyrotechnic pellet 164 burns gases released by ignition of the pellet 164 are trapped within the envelope 132 of the balloon, thereby inflating the balloon 130. In non-limiting examples, the pyrotechnic pellet 164 can be composed of a pyrotechnic material such as zirconium-potassium perchlorate, titanium-potassium perchlorate, boron-potassium nitrate, or the like. The pyrotechnic pellet 164 can be composed of less than one gram, less than 500 milligrams, or less than 250 milligrams of pyrotechnic material.

As noted above, the electronics package 104 can control certain operations of the shock-resistant memory device 100. In an exemplary embodiment, the electronics package 104 can include a detonator circuit that controls ignition of the pyrotechnic pellet 164. The seal body 116 of the shock-resistant memory device 100 includes a channel 168 that extends through the seal body 116 to the interior cavity 110 of the base portion 108 of the housing 102. An electrically conductive discharge wire 170 extends from the electronics package 104 through the channel 168 and to the pyrotechnic pellet 164. Referring once again to FIG. 3, the discharge wire 170 can be connected to the discharge capacitor 310. The battery 306 can charge the capacitor 310, and the capacitor 310 can be selectively controlled to discharge through the pyrotechnic pellet 164 by way of the wire 170, causing the pyrotechnic pellet 164 to ignite. In an exemplary embodiment, the discharge capacitor 310 can be controlled by way of the timer 308. For example, responsive to determining that a high-shock event has occurred (e.g., based upon loss of connection to the sensor 128), the timer 308 can begin a time count. Responsive to the time count reaching an ignition threshold, the discharge capacitor 310 can be controlled to discharge through the pyrotechnic pellet 164. The ignition threshold can be set short enough that the pyrotechnic pellet 164 is ignited and the balloon 130 inflated prior to the shock-resistant memory device 100 sinking too far in water for the balloon 130 to float the shock-resistant memory device 100 to the surface. The ignition threshold can be set long enough that the pyrotechnic pellet 164 is not ignited until a high-shock event has concluded. In exemplary embodiments, the ignition threshold can be three seconds, four seconds, or five seconds.

Figure 4:
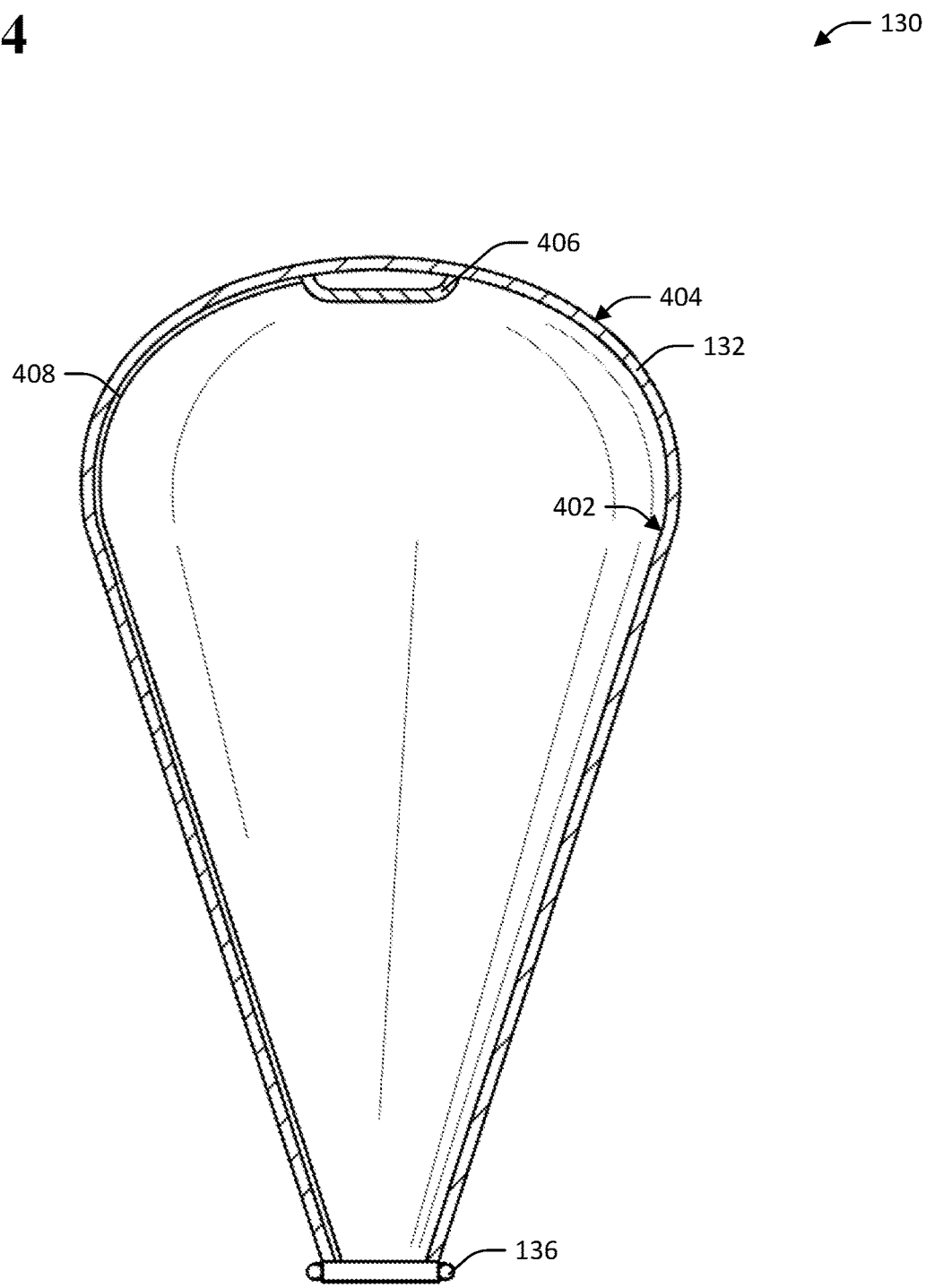
FIG. 4 is a diagram illustrating an exemplary balloon for facilitating recovery of a shock-resistant memory device.

The balloon 130 is configured to withstand the stresses of the shock-resistant memory device 100 being subjected to a high-shock event, and the subsequent stresses of inflation and exposure to the elements. Referring now to FIG. 4, a cross-sectional side view of the balloon 130 is illustrated wherein the balloon 130 is in its inflated state. The envelope 132 of the balloon 130 can be composed of an aramid fiber such as polyparaphenylene terephthalamide. In order to withstand the heat generated by combustion of the pyrotechnic pellet 164 during inflation of the balloon 130, an interior surface 402 of the envelope 132 can be coated in a heat-resistant coating. By way of example, the interior surface 402 of the envelope 132 can be coated in a heat-resistant silicone that can withstand temperatures up to or exceeding 1000° C.

The balloon 130 can further aid in recovery of the shock-resistant memory device 100 as well as preventing the device 100 from sinking in the case of water landings. By way of example, an exterior surface 404 of the envelope 132 can be coated in an infrared-reflective coating. In connection with recovering the shock-resistant memory device 100, a region can be illuminated by way of an infrared source. The infrared-reflective coating on the exterior surface 404 of the envelope 132 reflects radiation emitted by the infrared source. These reflections are detectable by infrared sensors such as are included in infrared goggles or as are mounted on unmanned aerial vehicles (UAVs). In an exemplary embodiment, a coating applied to the exterior surface 404 of the envelope 132 can be highly reflective of electromagnetic radiation in infrared wavelengths from 1.4 micrometers to 3 micrometers. Still further, the exterior surface 404 of the envelope 132 can be coated in a salt-resistant coating to improve survivability of the shock-resistant memory device 100 in ocean water. In an embodiment, the exterior surface 404 of the envelope 130 can be coated in an infrared-reflective coating and then subsequently coated in a polyurethane coating to protect the envelope 132 from damage that can be caused by saltwater.

To facilitate location of the shock-resistant memory device 100 prior to line-of-sight acquisition, the balloon 130 can further be configured to include an antenna 406 that is attached to the envelope 132 and a wire 408 that is connected to the antenna 406. In exemplary embodiments, the antenna 406 and the wire 408 are woven into the envelope 132 of the balloon 130. Referring once again to FIG. 1, the shock-resistant memory device 100 includes a wire 172 that connects the transmitter 312 of the electronics package 104 to the antenna 406 (e.g., by way of the wire 408). The transmitter 312 of the electronics package 104 can output a beacon signal to the antenna 406, which beacon signal is transmitted by the antenna 406. Radiation of the beacon signal by the antenna 406 facilitates location of the shock-resistant memory device 100 by way of any or all of the techniques of multilateration, triangulation, direction finding, or the like.

In some cases, it may be desirable for data stored on the memory module 106 to be destroyed if the shock-resistant memory device 100 is not recovered within a given period of time. For example, if data stored in the memory module 106 is of a confidential or sensitive nature, it may be desirable to prevent the data from falling into the hands of an adversary. Therefore, in some embodiments the shock-resistant memory device 100 can be configured to destroy the memory module 106 if the shock-resistant memory device 100 is not recovered within a certain amount of time. In an exemplary embodiment, the timer 308 can be configured to count to a destruction threshold time. Responsive to the timer 308 reaching the destruction threshold time, the discharge capacitor 310 can be selectively controlled to discharge into the memory module 106. The capacitor 310 can be configured such that discharge of the capacitor 310 into the memory module 106 is sufficient to destroy the memory module 106 or render its data contents unreadable. The electronics package 104 can therefore be configured to destroy the memory module 106 if a destruction threshold time is reached prior to the timer 308 or the capacitor 310 being disabled.

Figure 5A:
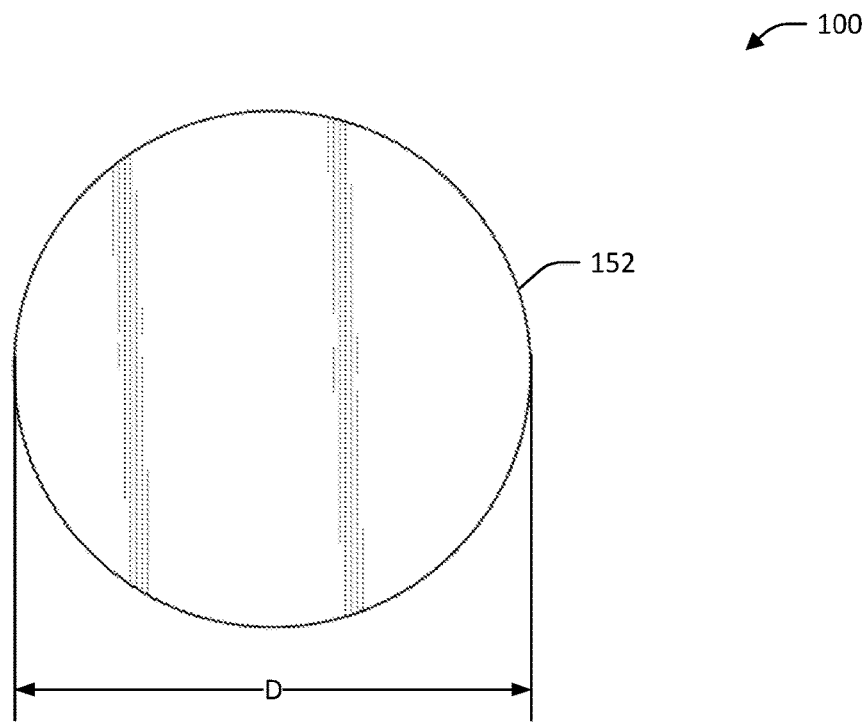
FIG. 5A is a top view of an exemplary shock-resistant memory device.
Figure 5B:
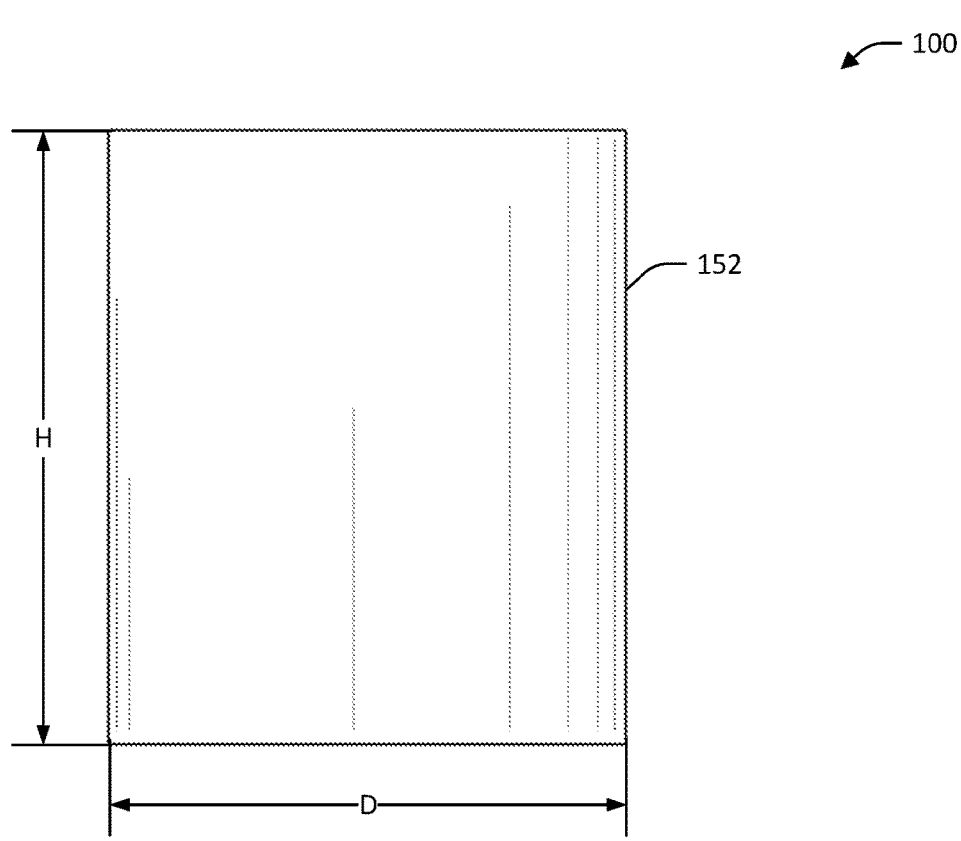
FIG. 5B is a side view of an exemplary shock-resistant memory device.

Referring now to FIGS. 5A and 5B, top and side views of the shock-resistant memory device 100 are shown, respectively. In the top and side views shown in FIGS. 5A and 5B, only the outer housing 152 of the shock-resistant memory device 100 is visible. The outer housing 152 is shown in FIGS. 5A and 5B as being of a substantially cylindrical shape. The shock-resistant memory device 100 has a diameter D and a height H. In an exemplary embodiment, the diameter D of the shock-resistant memory device 100 can be between 0.75 inches and 2.5 inches, between 1 inch and 2 inches, or between 1.25 inches and 1.75 inches. In further exemplary embodiments, the height H of the shock-resistant memory device can be between 0.5 and 2 inches, between 0.75 and 1.5 inches, or between 1 inch and 1.25 inches. It is to be understood that the shock-resistant memory device 100 could be made to be larger or smaller depending upon configuration of and materials used for various components of the shock-resistant memory device 100.

Figure 6:
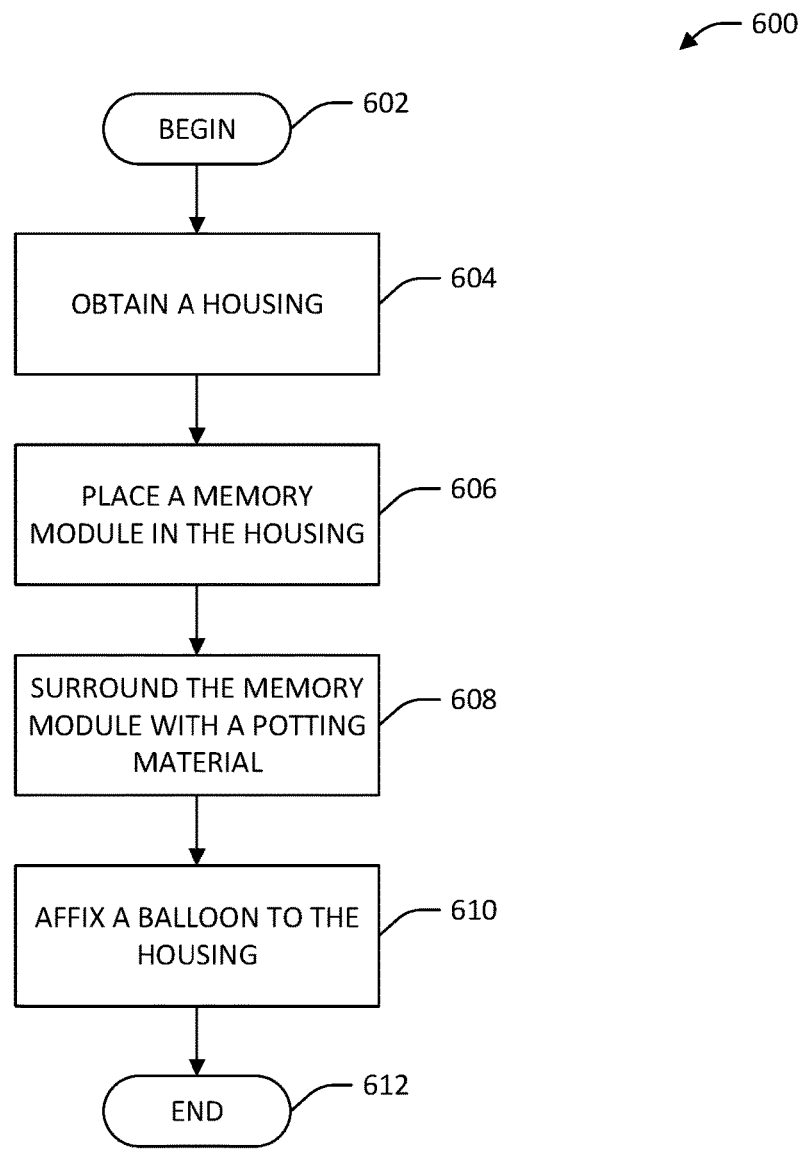
FIG. 6 is a flow diagram that illustrates an exemplary methodology for making a shock-resistant memory device.

FIG. 6 illustrates an exemplary methodology for manufacturing a shock-resistant memory device. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

Referring now to FIG. 6, a methodology 600 for manufacture of a shock resistant memory device is illustrated. The methodology 600 begins at 602, and at 604 a housing is obtained. The housing includes an interior cavity and can be composed of a strong material such as steel, titanium, or the like. At 606, a memory module is placed in the housing. The housing obtained at 604 can include a port that accommodates a data connection line between the memory module at a sensor from which data is desirably received by the memory module. The memory module can then retain the data for later retrieval subsequent to a high-shock event (e.g., in which an apparatus on which the shock-resistant memory device is installed is destroyed). At 608, the memory module is surrounded by a potting material. By way of example, an interior cavity of the housing in which the memory module is placed can be filled with a potting material such as an epoxy in order to hold the memory module in place within the housing. At 610, a balloon is affixed to the housing, wherein the balloon is configured to inflate subsequent to the high-shock event. In an exemplary embodiment, the balloon can be affixed to the housing by way of a seal body and sealing cap that are included in the housing, as described above with respect to FIG. 1. The methodology 600 completes at 612.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system for preserving data for retrieval subsequent to a high-shock event, the system comprising:
a housing that defines an interior cavity;
an electronics package disposed within the interior cavity of the housing, the electronics package comprising a transmitter and a memory module, the memory module storing data for retrieval subsequent to a high-shock event;
a potting material disposed within the housing and surrounding the electronics package such that the electronics package is suspended in the potting material;
a balloon affixed to the housing, the balloon configured to inflate subsequent to the high-shock event;
an antenna attached to a surface of the balloon; and
a wire running along a surface of the balloon and connecting the antenna to the transmitter, wherein responsive to the balloon being deployed, the transmitter transmits a beacon signal by way of the antenna.

2. The system of claim 1, the housing comprising:
an inlet port for inflow of the potting material into the interior cavity; and
an outlet port for outflow of excess potting material from the interior cavity during installation of the potting material in the housing.

3. The system of claim 1, further comprising:
a pyrotechnic device; and
a detonator circuit included in the electronics package, the detonator circuit connected to the pyrotechnic device and configured to cause ignition of the pyrotechnic device subsequent to the high-shock event, thereby causing the balloon to inflate.

4. The system of claim 3, the detonator circuit comprising a capacitor, the capacitor configured to discharge through the pyrotechnic device subsequent to the high-shock event.

5. The system of claim 1, wherein the wire is sewn into an envelope of the balloon.

6. The system of claim 1, wherein the balloon comprises an outer surface, the outer surface having an infrared-reflective coating applied thereto.

7. The system of claim 1, wherein the balloon comprises an inner surface, the inner surface having a heat-resistant coating applied thereto.

8. The system of claim 7, wherein the heat-resistant coating comprises a silicone-based coating.

9. The system of claim 1, the balloon comprising an envelope, the envelope comprising an aramid fiber material.

10. The system of claim 9, the balloon further comprising an O-ring seal, the housing comprising a protrusion around which the O-ring seal of the balloon is fitted.

11. The system of claim 10, further comprising a seal cap, the seal cap affixed to the protrusion of the housing such that the O-ring seal of the balloon is held between the sealing cap and the protrusion.

12. The system of claim 1, wherein the housing is comprised of maraging steel.

13. A shock-resistant memory device, comprising: a housing, the housing comprising: a base portion, the base portion comprising an interior cavity and an opening from the interior cavity, a memory module disposed within the housing, the memory module storing data for retrieval subsequent to a high-shock event; a potting material disposed within the housing and surrounding the memory module such that the memory module is suspended in the potting material; and a balloon affixed to the housing; the memory module and the potting material disposed within the interior cavity: a seal body, the seal body threaded into the opening of the base portion, and wherein the balloon is fitted about a protruding portion of the sealing body: and a sealing cap, the sealing cap threaded about the seal body such that the balloon is affixed to the housing between the seal body and the sealing cap; the balloon configured to inflate subsequent to the high-shock event.

14. The shock-resistant memory device of claim 13, the base portion comprising a sidewall extending outward about the seal body, wherein the sealing cap is further threaded into the sidewall of the base portion.

15. The shock-resistant memory device of claim 14, wherein threads of the sidewall of the base portion have an opposing direction to threads of the seal body.

16. The shock-resistant memory device of claim 13, further comprising a flexible circuit board disposed within the housing and surrounded by the potting material, wherein the memory module is mounted to the flexible circuit board.

17. A system for preserving contents of a memory subsequent to an impact event, the system comprising:
   a housing;
   a memory module disposed within the housing;
   a transmitter disposed within the housing;
   a potting material disposed within the housing and surrounding the memory module such that the memory module is suspended in the potting material;
   a sensor connected to the memory module and configured to output sensor data to the memory module prior to the impact event, the memory module storing the sensor data for retrieval subsequent to the impact event;
   a balloon attached to the housing and configured to inflate after the impact event;
   an antenna attached to a surface of the balloon; and
   a wire running along a surface of the balloon and connecting the antenna to the transmitter, wherein responsive to the balloon being deployed, the transmitter transmits a beacon signal by way of the antenna.

18. The system of claim 17, further comprising a timing circuit, wherein the balloon inflates responsive to the timing circuit reaching a threshold time count.

* * * * *